(12) United States Patent
Lemke et al.

(10) Patent No.: US 10,509,369 B1
(45) Date of Patent: Dec. 17, 2019

(54) METHOD OF MANUFACTURING A VAPOR CELL FOR ALKALINE-EARTH-LIKE ATOMS INSIDE AN ULTRAHIGH VACUUM CHAMBER

(71) Applicant: Government of the United States, as represented by the Secretary of the Air Force, Kirtland AFB, NM (US)

(72) Inventors: Nathan D. Lemke, Albuquerque, NM (US); Christopher J. Erickson, Beavercreek, OH (US); Jordan L. Armstrong, Albuquerque, NM (US); Kyle W. Martin, Albuquerque, NM (US)

(73) Assignee: THE GOVERNMENT OF THE UNITED STATES OF AMERICA AS REPRESENTED BY THE SECRETARY OF THE AIR FORCE, Washington, DC (US)

( * ) Notice: Subject to any disclaimer, the term of this patent is extended or adjusted under 35 U.S.C. 154(b) by 6 days.

(21) Appl. No.: 15/946,115

(22) Filed: Apr. 5, 2018

(51) Int. Cl.
*G04F 5/14* (2006.01)
*H03L 7/26* (2006.01)

(52) U.S. Cl.
CPC . *G04F 5/14* (2013.01); *H03L 7/26* (2013.01)

(58) Field of Classification Search
CPC ........................................................ G04F 5/14
USPC ....................................................... 331/94.1
See application file for complete search history.

(56) References Cited

U.S. PATENT DOCUMENTS

| | | | |
|---|---|---|---|
| 4,666,251 A | 5/1987 | Liberman | |
| 5,256,995 A | 10/1993 | Scholes | |
| 5,528,028 A | 6/1996 | Chu | |
| 6,900,702 B2 | 5/2005 | Youngner | |
| 7,215,213 B2 | 5/2007 | Mescher | |
| 7,359,059 B2 | 4/2008 | Lust | |
| 7,619,485 B2 | 11/2009 | DeNatale | |
| 7,786,808 B2 | 8/2010 | DeNatale | |
| 8,005,332 B2 | 8/2011 | Schmidt | |
| 8,526,000 B1 | 9/2013 | Schober | |
| 8,710,935 B2 * | 4/2014 | Schober | G04F 5/14 331/94.1 |
| 9,024,397 B2 * | 5/2015 | Hopper | H03L 7/26 257/421 |

(Continued)

OTHER PUBLICATIONS

Erickson et al. "High-Temperature Calcium Vapor Cell for Spectroscopy on the 4s2 $^1S_0$-4s4p $3P_1$ Intercombination Line", Review of Scientific Instruments, vol. 76, 123110-1, American Institute of Physics, Dec. 27, 2005 (5 Pages).

(Continued)

*Primary Examiner* — Joseph Chang
(74) *Attorney, Agent, or Firm* — James M. Skorich (57) ABSTRACT

A method of making an atomic vapor source includes positioning a glass base of a vapor cell in a vacuum chamber, providing an alkaline-earth metal in the glass base, and positioning a linear motion feedthrough mechanism adjacent the vacuum chamber in line with the glass base. The method includes sealing and evacuating the vacuum chamber, and positioning, using a linear motion actuator of the linear motion feedthrough mechanism, a glass lid to contact the glass base of the vapor cell to form an optical contact bond therebetween.

23 Claims, 4 Drawing Sheets

(56) References Cited

U.S. PATENT DOCUMENTS

2006/0022761 A1   2/2006   Abeles
2017/0146958 A1   5/2017   Gallinet

OTHER PUBLICATIONS

Erickson et al. "Calcium Vapor Cell Heating", Provisional Patent Application Specification, Filed with the USPTO as U.S. Appl. No. 62/244,081, filed Oct. 20, 2015 (5 Pages).
Erickson et al. "Robust Optical Clocks based on Alkaline-Earth Vapor Cells", Frontiers in Optics/ laser Science 2015, OSA 2015, OCIS Codes: 120.0120, 120.04800, Dated Oct. 20, 2015 (1 Page).
Armstrong et al. "Robust Optical Clocks Based on Alkaline-Earth Vapor Cells", 2016 Precise Time and Time Interval Meeting, ION PTTI 2016, Monterey, CA, Jan. 25-28, 2016 (3 Pages).
Armstrong et al. "Thermal Design of High Temperature Alkaline-Earth Vapor Cells", Photonics West Conference Proceedings, Dated Feb. 16, 2016 (4 Pages).
Armstrong et al. "Thermal Design of High Temperature Alkaline-Earth Vapor Cells", International Frequency Control Symposium Poster Session, May 11, 2016 (1 Page).

* cited by examiner

METHOD OF MANUFACTURING A VAPOR CELL FOR ALKALINE-EARTH-LIKE ATOMS INSIDE AN ULTRAHIGH VACUUM CHAMBER

GOVERNMENT INTEREST

The invention described herein may be manufactured and used by or for the Government of the United States for all governmental purposes without the payment of any royalty.

CROSS-REFERENCE TO RELATED APPLICATIONS

This application is related to U.S. patent application Ser. No. 15/946,350, filed on Apr. 5, 2018, titled "Vapor Cell Heating Assembly," the entire disclosure of which is incorporated herein by reference.

FIELD OF THE INVENTION

The present invention relates to the fields of vapor cells. As disclosed herein, the present invention relates to methods of manufacturing a vapor cell for alkaline-earth metal atoms inside a vacuum chamber.

BACKGROUND OF THE INVENTION

The two main categories of atomic clocks include 1) radio frequency (RF) or microwave clocks and 2) optical clocks. The RF clocks have many forms and include passing atoms through microwave fields to drive the atom into a different atomic state, detecting the state change, and then using that information to control or discipline a microwave source (usually a quartz oscillator). The three most common commercial microwave clocks are rubidium vapor cell clocks, cesium beam tubes, and hydrogen masers.

Optical clocks also come in many different forms spanning the use of vapor cells, thermal beams, and cooled ensembles of atoms. The fundamental principle of an optical atomic clock is that a laser is frequency locked to a specific atomic transition and then the laser is used to discipline a frequency comb. The frequency comb is a pulsed laser whose repetition rate can be used for timing purposes when disciplined by the frequency standard that is referencing the atoms.

Optical clocks boast higher performance than RF clocks but have not been developed for use outside of a laboratory for several reasons. The primary reason is that the laser systems usually require laboratory-like environments and large amounts of power. Also, an optical clock that requires laser cooled atoms typically requires multiple laser systems and a complex and sensitive optical arrangement. While thermal beam optical clocks can benefit from using a single laser rather than multiple laser systems, thermal beam optical clocks typically require regular servicing and have a limited supply of atoms. Also, for the highest performance, a thermal beam optical clock may require optical alignments that are not resilient enough to operate outside of a laboratory environment.

Vapor cell optical atomic clocks may provide a desired trade-off between performance and environmental sensitivity because they rely on a single laser, the atoms remain in the system indefinitely, and they do not require particularly stringent optical alignments. However, conventional optical atomic clock designs require either iodine or rubidium, neither of which may meet performance objectives because of the properties of the atomic or molecular transitions. Approaches for containing atoms that offer higher performance in a vapor cell appear to be lacking.

Alkaline-earth atoms are known to possess spectrally narrow electronic transitions that can be accessed with visible laser sources. Such alkaline-earth atoms include calcium, strontium, magnesium, barium, radium, zinc, cadmium, and ytterbium, for example. These narrow transitions form the basis for the world's most precise clocks and have other appealing metrological features that find application in magnetometry, atom interferometry, formation and study of Bose-Einstein Condensates, and searches for physics beyond the Standard Model of elementary particles.

However, accessing these transitions requires a dense and sometimes cold source of atomic vapor, which may be challenging due to the low vapor pressure of these atoms. Scientific literature shows that certain glasses and crystalline materials may be able to contain vapors of these atoms at the requisite temperature without damage. However, forming a pure environment free from background particles may be difficult due to the inability to have a fill port through which the background gas could be removed, and the desired alkaline-earth material could be added.

A second concern for a potential vapor cell is that many of the above applications require multiple degrees of optical access, including (in the case of a vapor cell whose shape is a rectangular prism) from all six faces. Multiple degrees of optical access can be important for providing access to a clock laser, for observing performance attributes, and for certain applications like magneto optical traps, which require optical access from six sides of the cell. Providing multiple degrees of optical access is generally incompatible with the need to heat and insulate the vapor cell to support the needed temperature (typically 400-600 degrees Celsius) to form a vapor.

Therefore, a need exists for a technique by which a pure atomic vapor source may be developed inside of a compact cell, capable of supporting residual background pressures on the order of $10^{-6}$ to $10^{-8}$ Torr, for example, so that the electronic transitions associated with alkaline earth atoms can be accessed for such applications like optical atomic clocks. Also, a need exists for a technique by which a compact vapor cell may be heated to the desired temperatures without severely diminishing optical access to the vapor.

This background information is provided to reveal information believed by the applicant to be of possible relevance to the present invention. No admission is necessarily intended, nor should be construed, that any of the preceding description constitutes prior art against the present invention.

BRIEF SUMMARY OF THE INVENTION

With the above in mind, embodiments of the present invention are related to methods of manufacturing a vapor cell for alkaline-earth metal atoms inside a vacuum chamber.

A purpose of the present embodiments is to make a vapor cell containing alkaline-earth elements, such as calcium and/or strontium, for use in an optical atomic clock. Another purpose of the embodiments is to provide an atomic vapor source inside of a compact cell capable of supporting residual background pressures on the order of at least $10^{-6}$ to $10^{-8}$ Torr, for example, and that may be heated to the desired temperatures without severely diminishing optical access to the vapor.

An embodiment is directed to a method of making an atomic vapor source. The method includes positioning a glass or crystal base of a vapor cell in a vacuum chamber, providing an alkaline-earth metal in the glass base, and positioning a linear motion feedthrough mechanism adjacent the vacuum chamber in line with the glass base. The method includes sealing and evacuating the vacuum chamber, and positioning, using a linear motion actuator of the linear motion feedthrough mechanism, a glass lid to contact the glass base of the vapor cell to form an optical contact bond therebetween.

Additionally, or alternatively, sealing and evacuating further comprises evacuating the vacuum chamber to a pressure of $\leq 10^{-6}$ Torr.

Additionally, or alternatively, the method may include, prior to positioning the glass base: pre-sealing and pre-evacuating the vacuum chamber; and unsealing and venting the vacuum chamber to an over-pressurized inert gas environment.

Additionally, or alternatively, pre-sealing and pre-evacuating further comprises evacuating the vacuum chamber to a pressure of $\leq 10^{-6}$ Torr.

Additionally, or alternatively, positioning the glass base further comprises positioning the glass base on a support within the vacuum chamber.

Additionally, or alternatively, the method may further include: positioning the glass lid within the vacuum chamber adjacent the glass base of the vapor cell prior to positioning the linear motion feedthrough mechanism adjacent the vacuum chamber; positioning the linear motion actuator of the linear motion feedthrough mechanism proximate the glass lid positioned adjacent the glass base; and moving the glass lid relative to the glass base, using the linear motion actuator.

Additionally, or alternatively, the linear motion feedthrough mechanism may be positioned above the vacuum chamber in line with the glass base in a vertical arrangement, and the glass lid may further include an adhesive layer on an upper surface thereof to aid in the moving of the glass lid using the linear motion actuator.

Additionally, or alternatively, the method may further include providing a heating assembly within the vacuum chamber proximate the glass base, and performing a vacuum bake-out of the glass base, using the heating assembly, prior to bonding the glass lid to the glass base. Here, the linear motion feedthrough mechanism may be positioned adjacent the vacuum chamber in line with the glass base in a horizontal arrangement, and the glass lid may be slid into contact with the glass base via the linear motion actuator of the linear motion feedthrough mechanism.

Additionally, or alternatively, the alkaline-earth metal may be at least one of calcium and strontium, and the glass base and the glass lid may be an alkali-resistant, transparent medium, such as an alkali-resistant glass or crystal.

Another embodiment is directed to a method of making an atomic vapor source, including decontaminating a vacuum chamber by initially sealing and evacuating the vacuum chamber, and then unsealing and venting the vacuum chamber to an inert gas environment. A glass base of a vapor cell is positioned in the vacuum chamber. The method includes providing an alkaline-earth metal in the glass base, positioning a glass lid in the vacuum chamber and adjacent the glass base of the vapor cell without forming an optical contact bond therebetween, positioning a linear motion actuator proximate to the glass lid, and moving the glass lid relative to the glass base using the linear motion actuator. Further, the method includes secondarily sealing and evacuating the vacuum chamber, and positioning, using the linear motion actuator, the glass lid to contact the glass base of the vapor cell to form an optical contact bond therebetween.

Additionally, or alternatively, initially sealing and evacuating may further include evacuating the vacuum chamber to a pressure of $\leq 10^{-6}$ Torr.

Additionally, or alternatively, secondarily sealing and evacuating may further include evacuating the vacuum chamber to a pressure of $\leq 10^{-6}$ Torr.

Additionally, or alternatively, positioning the glass base further comprises positioning the glass base on a platform within the vacuum chamber.

Additionally, or alternatively, the glass lid further comprises an adhesive layer on a surface thereof to aid in moving of the glass lid using the linear motion actuator.

Additionally, or alternatively, the alkaline-earth metal further comprises at least one of calcium and strontium.

Additionally, or alternatively, positioning the linear motion actuator further comprises positioning a linear motion feedthrough mechanism adjacent the vacuum chamber in line with the glass lid and the glass base.

Another embodiment is directed to an atomic vapor source prepared by a process comprising: initially sealing and evacuating an ultrahigh vacuum chamber (i.e., an ultrahigh vacuum chamber where pressure may approach $10^{-9}$ Torr); unsealing and venting the vacuum chamber to an over-pressurized inert gas environment; positioning a glass base of the vapor cell in the ultrahigh vacuum chamber; providing an alkaline-earth metal in the glass base; positioning a glass lid adjacent the glass base of the vapor cell in the ultrahigh vacuum chamber; positioning a linear motion feedthrough mechanism adjacent the ultrahigh vacuum chamber in line with the glass lid and the glass base; positioning a linear motion actuator of the linear motion feedthrough mechanism to contact the glass lid; moving the glass lid relative to the glass base using the linear motion actuator; secondarily sealing and evacuating the ultrahigh vacuum chamber; and positioning, using the linear motion actuator, the glass lid into contact with the glass base of the vapor cell to form an optical contact bond therebetween.

Additionally, or alternatively, initially sealing and evacuating further comprises evacuating the ultrahigh vacuum chamber to a pressure of $\leq 10^{-6}$ Torr.

Additionally, or alternatively, secondarily sealing and evacuating further comprises evacuating the ultrahigh vacuum chamber to a pressure of $\leq 10^{-6}$ Torr.

Additionally, or alternatively, the alkaline-earth metal may be at least one of calcium and strontium.

Another embodiment is directed to an atomic vapor source including an alkali-resistant glass base defining an interior space, an alkali-resistant glass lid in contact with the alkali-resistant glass base and having an optical contact bond therebetween to define an evacuated environment in the interior space, an alkaline-earth metal in the evacuated environment, and a multi-layer heating assembly including a heat spreading layer in contact with at least the alkali-resistant glass base, a heating element layer surrounding at least the alkali-resistant glass base, and a structural support layer holding the heat spreading layer and the heating element layer around the alkali-resistant glass base. The multi-layer heating assembly is configured to provide optical access to the evacuated environment and alkali-earth metal therein from multiple different directions.

Additionally, or alternatively, the evacuated environment is evacuated to a pressure of $\leq 10^{-6}$ Torr.

Additionally, or alternatively, the alkali-resistant glass base comprises a rectangular alkali-resistant glass base;

wherein the heat spreading layer comprises sapphire slides on six sides of the rectangular alkali-resistant glass base; wherein heating element layer comprises picture frame shaped aluminum nitride encased tungsten heating elements on at least four sides of the rectangular alkali-resistant glass base; wherein the structural support layer comprises a copper shell; and wherein the multi-layer heating assembly is configured to provide optical access to the evacuated environment and alkali-earth metal therein from six different directions.

Additionally, or alternatively, the alkaline-earth metal is at least one of calcium and strontium.

The use of the linear actuation to perform the optical contact bonding in the vacuum chamber provides a vapor cell containing alkaline-earth elements, such as calcium and/or strontium. The present technique may provide a vapor cell for use in an optical atomic clock. Vapor cells created using various embodiments of the inventive methods may advantageously present low size, weight, and power high-performance atomic clocks. Calcium and strontium optical atomic clocks in various forms and configurations may be known in the art but are not capable of operating outside of a laboratory environment at performance levels of interest.

Vapor cells created using various embodiments of the inventive methods may advantageously enable a high stability and potentially high accuracy frequency standard. One primary use of the standard would be to discipline an optical frequency comb in order to provide microwave frequencies with the same stability as the optical oscillator (laser). Advantages of calcium and strontium docks bunt in this manner may be associated with having only one laser system to realize the optical frequency standard avoiding the need to replenish the atomic sample.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

Embodiments of the present approach provide a vapor cell containing alkaline-earth elements, such as calcium and/or strontium, for use in an optical atomic clock. Another purpose of the embodiments is to provide an atomic vapor source inside of a compact cell capable of supporting residual background pressures on the order of at least $10^{-6}$ to $10^{-8}$ Torr that may be heated to predetermined temperatures without severely diminishing optical access to the atomic vapor within the vapor cell.

Referring now to FIGS. 1-5, example embodiments of the arrangements, methods and vapor cell will now be described. FIGS. 1A and 1B show an example of a vertical arrangement used in a method of making a vapor cell in accordance with features of an embodiment of the present invention.

Figure 1A:
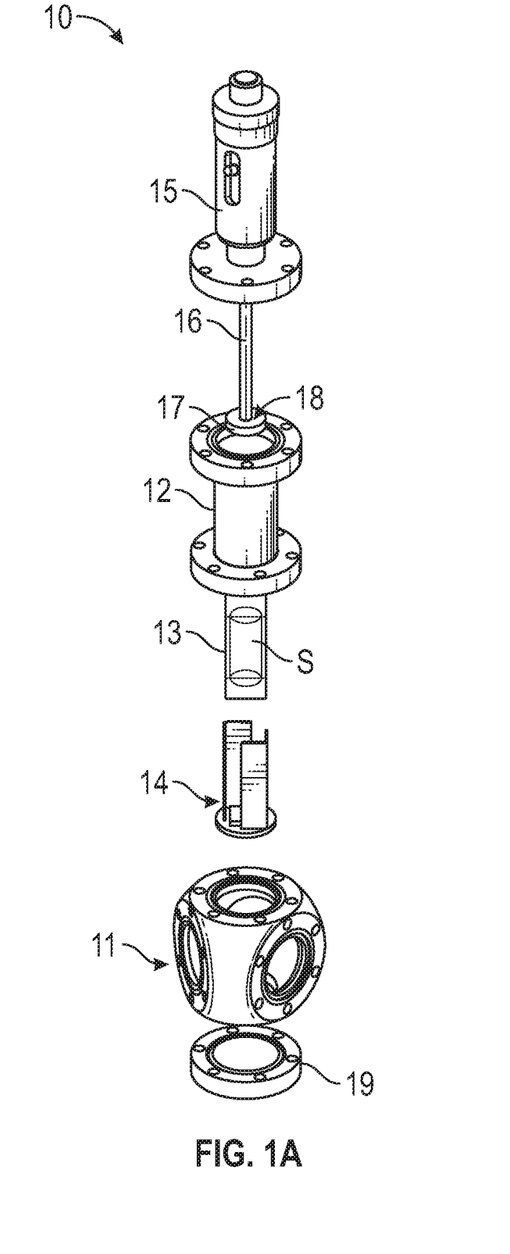
FIG. 1A is an exploded perspective view illustrating a vertical arrangement of a vacuum chamber, linear feedthrough mechanism, support, vapor cell and holder used in the method in accordance with features of the present invention.

The vertical arrangement may include the use of a vacuum chamber 11. For example, and without limitation, a vacuum chamber 11 may be a rigid enclosure from which air and other gases may be removed by a vacuum pump, as would be appreciated by those skilled in the art. This may result in a low-pressure, or evacuated, environment within the chamber, referred to as a vacuum. The vacuum chamber 11 may be an ultrahigh vacuum chamber which can accommodate pressures that may approach $10^{-9}$ Torr. A vacuum or evacuated environment may allow researchers to conduct physical experiments or to test mechanical devices which must operate in low-pressure environments, such as outer space, or for processes requiring low-pressure environments, such as vacuum drying or vacuum coating. Only some materials may be suitable for vacuum use. Such vacuum chambers often have multiple ports, covered with vacuum flanges, to allow instruments or windows to be installed so as to monitor or access the interior of the chamber. Such flanges may be sealed to the chamber. For example, and without limitation, a base flange 19 and a component flange 12 are shown in FIG. 1A.

A vapor cell glass base 13, such as a glass or crystal base, may be held by a structure within the vacuum chamber such as a jig, platform, track or support 14 for positioning and/or aligning the vapor cell glass base 13 within the vacuum chamber 11 to ensure that the final optical contact bond is made squarely. For example, and without limitation, the glass base 13 may preferably be an alkali resistant glass, crystal, or other transparent medium, such as a calcium fluoride crystal. The glass base 13 may hold an alkali-earth metal in an interior space S defined therein. In some embodiments, the alkaline-earth metal may be at least one of calcium and strontium.

A linear motion feedthrough mechanism 15 may be secured on the vacuum chamber 11 at component flange 12 directly above and/or in-line with the glass base 13. The linear motion feedthrough mechanism 15 may include a linear motion actuator 16 configured to position a glass lid 17 on the glass base 13 within the vacuum chamber 11. The glass lid 17 may also be an alkali-resistant glass, crystal, or other transparent medium, such as a calcium fluoride crystal.

As a matter of definition, a linear actuator is a mechanical device that converts energy (e.g., power from air, electricity, or liquid) to create motion in a straight line. Hydraulic or pneumatic cylinders produce linear motion. Other mechanisms, such as a rotating motor, can also be used to generate linear motion. As illustrated in FIG. 1A the linear motion feedthrough mechanism 15 may be any or more of these mechanisms, and in some embodiments, may also be a manually operated device.

Initially, the vacuum chamber 11 may be sealed and evacuated for purposes of removing oxygen and other contaminants from the chamber. In some embodiments, the evacuated environment inside vacuum chamber 11 can be evacuated to a pressure of $\leq 10^{-6}$ Torr, for example, and without limitation. The vacuum chamber 11 may then be vented to an inert gas environment. For example, and without limitation, the vacuum chamber component flange 12 may be removed under an over-pressurized inert gas environment to reduce oxygen impurities. The vapor cell glass base 13 may be inserted into the platform 14, the alkaline-earth metal of interest may be placed inside glass base 13, and the glass lid 17 may be placed on the glass base 13 but not optically contacted.

More particularly, it will be appreciated that because alkaline-earth materials, such as calcium, react with oxygen to create an oxide (e.g. calcium oxide), an objective of the present disclosure is to achieve a closed glass vapor cell using, as an example, pure calcium but no residual gas. To decontaminate or remove the atmospheric impurities, the vacuum chamber 11 can be initially evacuated, and then vented to an inert gas environment (e.g. to argon). Then the alkaline-earth metal can be disposed inside the vapor cell, the lid 17 placed thereon, and the vacuum chamber 11 again evacuated. Venting to an inert gas such as argon is desired because, venting to the atmosphere would introduce oxygen into the cell. Overpressuring the system with an inert gas such as argon prevents oxygen from entering the system. After a suitable vacuum has been reached, the vapor cell is closed via a contact bond as detailed below.

In some embodiments, an adhesive layer 18 may be applied to the glass lid 17 to aid in the positioning thereof by the linear motion actuator 16. In other embodiments, alternatives to adhesive layer 18 such as temporary fasteners, actuating assemblies, and the like may be used for similar purposes. The linear motion actuator 16 or rod may be lowered to the point of slight contact with the adhesive layer 18 to stabilize and position the glass lid 17 on the glass base 13. Linear motion actuator 16 may then raised such that the glass lid 17 is raised high enough to allow the interior of the glass base 13 to be evacuated. The vacuum chamber 11 may be evacuated once again to a suitable pressure, such as about $\leq 10^{-6}$ Torr in the exemplary embodiment. Once evacuated, the linear motion actuator 16 may be lowered again such that the glass lid 17 may be set or pressed to create an optical contact bond between glass lid 17 and the glass base 13, sealing the alkali-earth metal inside to define a vapor cell (not pictured).

An optical contact bond allows the vapor cell to withstand the environmental effects to which it can be exposed. Eventually, in use, the vapor cell may be heated up to temperatures >400 C. An optical contact bond allows the lid to be secured to the body of the vapor cell such that it can withstand these temperatures. To produce an optical contact bond between two surfaces, the surfaces should be practically conformal (i.e., completely or nearly flat), be exceptionally clean, and free from any minor contamination that would prevent or weaken the bond (e.g., films, dust, and other surface contaminants). For bonding to occur, the surfaces need only to be brought together, and the intermolecular forces may draw the bodies into the lowest energy conformation; no pressure may need to be applied. When two materials are flat enough and clean enough they can be put into optical contact with each other creating a vacuum tight strong adhesive free bond. The intermolecular force that holds the macroscopic pieces together is the Van der Waals force.

Figure 5:
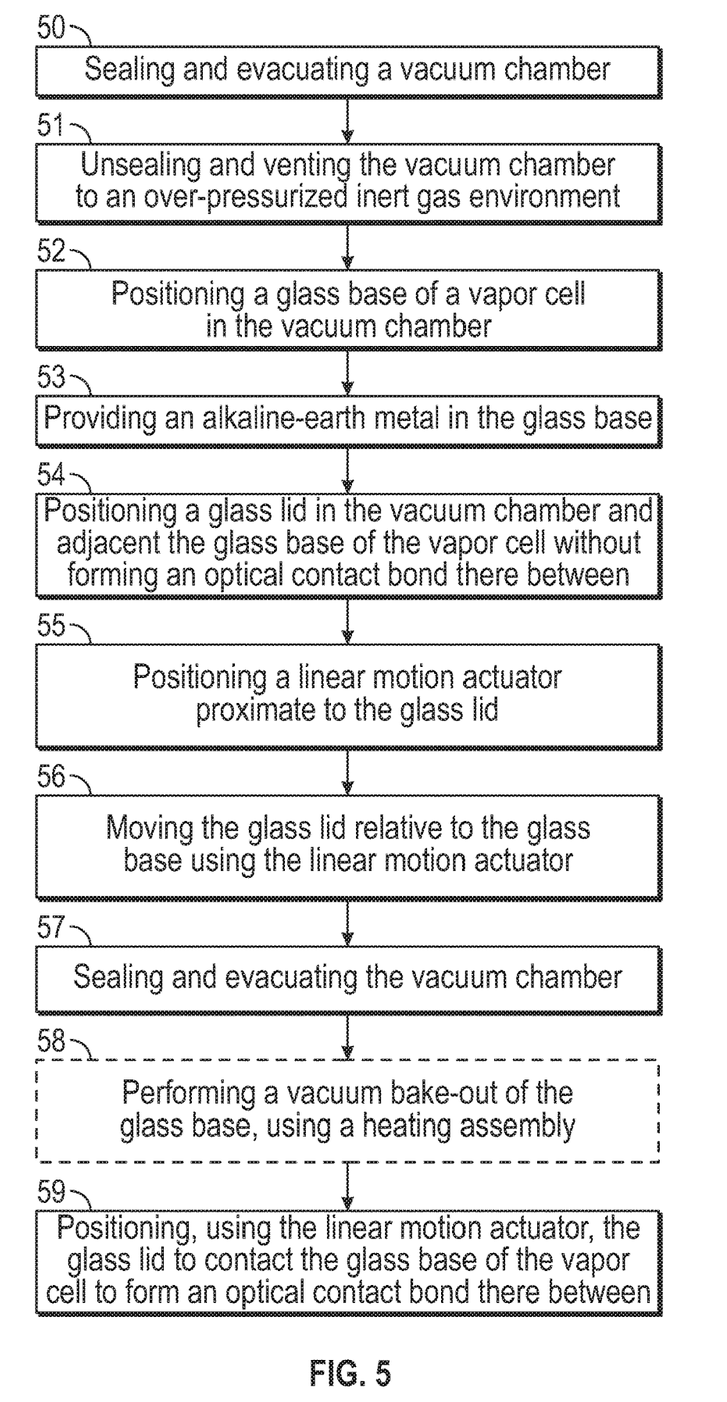
FIG. 5 is a flowchart illustrating a method of making a vapor cell according to features of the present invention.

Continuing to refer to FIG. 1A, and referring additionally to the flowchart in FIG. 5, an embodiment of the present invention may be directed to a method of making an atomic vapor source. The method may include, at Block 52, positioning a glass base 13 of a vapor cell in a vacuum chamber 11, and, at Block 53, providing an alkaline-earth metal in the glass base 13. For example, and without limitation, the glass base 13 may be positioned on a platform 14 that may support the glass base 13 during the following steps. Prior to such steps, the method may include, at Block 50, sealing and evacuating the vacuum chamber 11 and, at Block 51, unsealing and venting the vacuum chamber 11 to an over-pressurized inert gas environment as described above. A person of skill in the art will immediately note that the glass base 13 may be positioned in the vacuum chamber 11 with the alkali-earth metal already held in the interior space therein.

The method may continue with positioning of a linear motion feedthrough mechanism 15 adjacent the vacuum chamber 11 and in line with the glass base 13 (Block 55). The glass lid 17 could be positioned (Block 54) in the vacuum chamber 11 adjacent the glass base 13 prior to or after positioning of the linear motion feedthrough mechanism 15 at Block 55, depending on the arrangement. The method may include, at Block 57, sealing and evacuating the vacuum chamber 11, and positioning, at Block 59, using a linear motion actuator 16 of the linear motion feedthrough mechanism 15, the glass lid 17 to contact the glass base 13 of the vapor cell to form an optical contact bond therebetween, as discussed above.

Figure 1B:
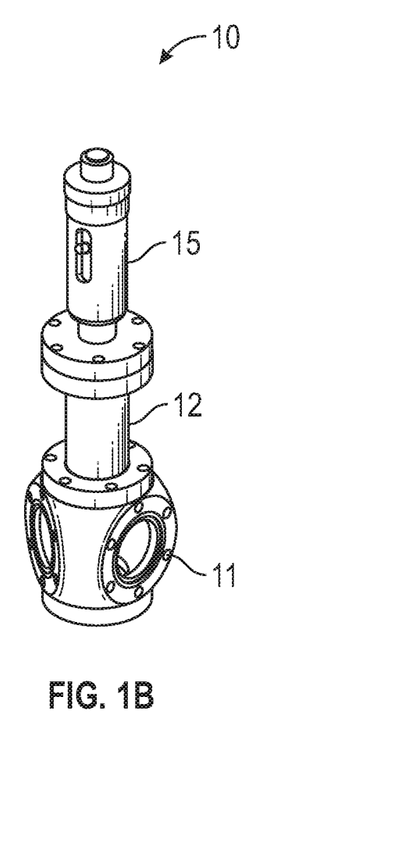
FIG. 1B is a perspective view illustrating the assembled features of FIG. 1.

In the vertical arrangement of the present invention shown in FIGS. 1A and 1B, the linear motion feedthrough mechanism 16 may be positioned above the vacuum chamber 11 in line with the glass base 13. The method may also include, at Block 56, moving the glass lid 17 (e.g., lifting it off the glass base 13) relative to the glass base 13 using the linear motion actuator 16 prior to sealing and evacuating the vacuum chamber 11 at Block 57. As described above, an adhesive layer 18 on an upper surface of the glass lid 17 may be applied so as to provide a stabilizing surface interface between glass lid 17 and linear motion actuator 16. The adhesive layer 18 may aid in the moving of the glass lid 17 using the linear motion actuator 16.

Figure 2A:
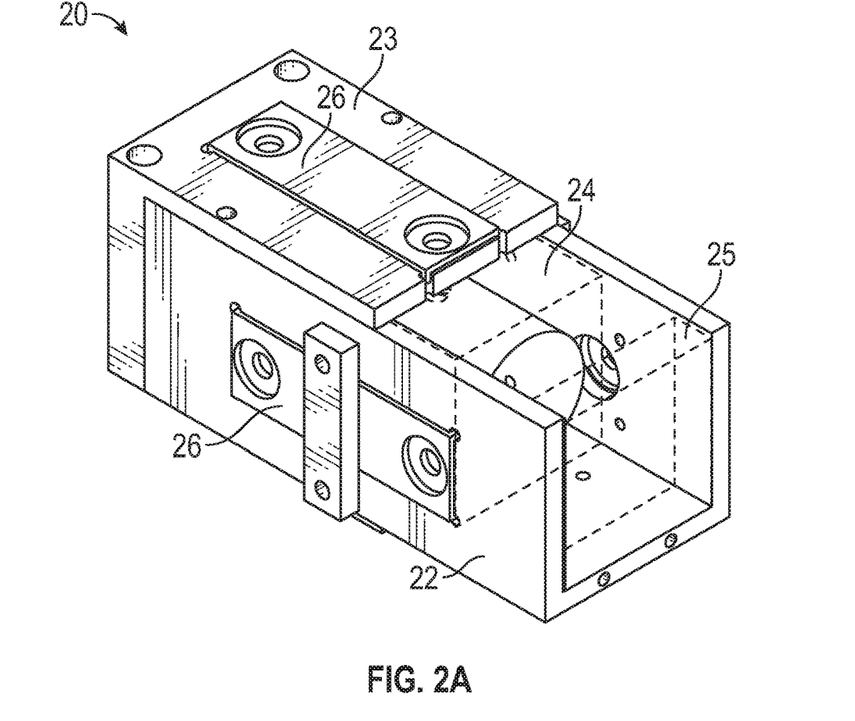
FIG. 2A is a perspective view illustrating a horizontal arrangement of the vacuum cell body and lid positioned within a holder and a heating assembly used in a method of an embodiment of the present invention.
Figure 2B:
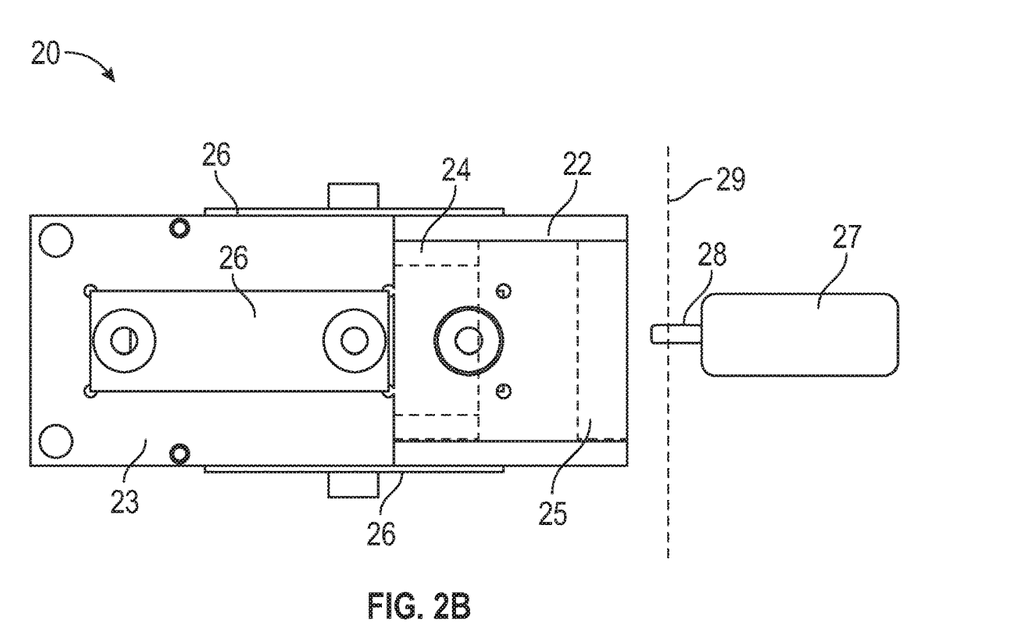
FIG. 2B is a top view of the horizontal arrangement of FIG. 2A including the linear actuator used in a method of an embodiment of the present invention.

FIGS. 2A and 2B show an example of a horizontal arrangement used in a method of another embodiment of the present invention. The horizontal arrangement may include the use of a structural support 20 which may be rectangular shaped, for example, and without limitation, and may include various components such as a bench 22 and cap 23. The glass base 24 or body (e.g., which may also be rectangular shaped, as shown) of the vapor cell may be held by the structural support 20 during the method steps described below. The glass lid 25 may also be held thereon, and may be slid across the bench 22 towards the glass base 24 when optical bonding is performed. A heating assembly 26 may include heating elements (not pictured) positioned on the sides of the structural support 20. The linear motion feedthrough mechanism 27 with linear motion actuator 28 may be positioned adjacent the vacuum chamber 29 in line with the glass base in this horizontal arrangement embodiment.

As such, the method of FIG. 5 may further include providing the heating assembly within the vacuum chamber 29 proximate the glass base 24, and performing (Block 58) a vacuum bake-out of the glass base 24 (e.g., with the alkali-earth metal held therein), using the heating assembly 26, prior to bonding the glass lid 25 to the glass base 24. Heat may be applied to further reduce the background pressure via the vacuum bake-out prior to the optical bonding.

Moreover, heat may reduce or remove impurities and residual gases from the cell via a bake-out process approaching temperatures of 500° C. Such impurities and gases could impact performance of the cell as, depending on the operational temperature, impurities and gases like water vapor can exit the vapor cell material and react/interact with the atomic vapor, thus impacting the cell's performance.

At this point in assembly, in accordance with Block 59 described above, the linear motion feedthrough mechanism 27 may be positioned adjacent the vacuum chamber 29 in line with the glass base 24 in this horizontal arrangement, and the glass lid 25 may be moved along the bench 22 into contact with the glass base 24 via the linear motion actuator 28 of the linear motion feedthrough mechanism 27.

The description of method steps or sub-steps in a particular order does not mean that the embodiments require that particular order. Indeed, the order of steps or sub-steps may be carried out in a different order than in the examples described.

Figure 3:
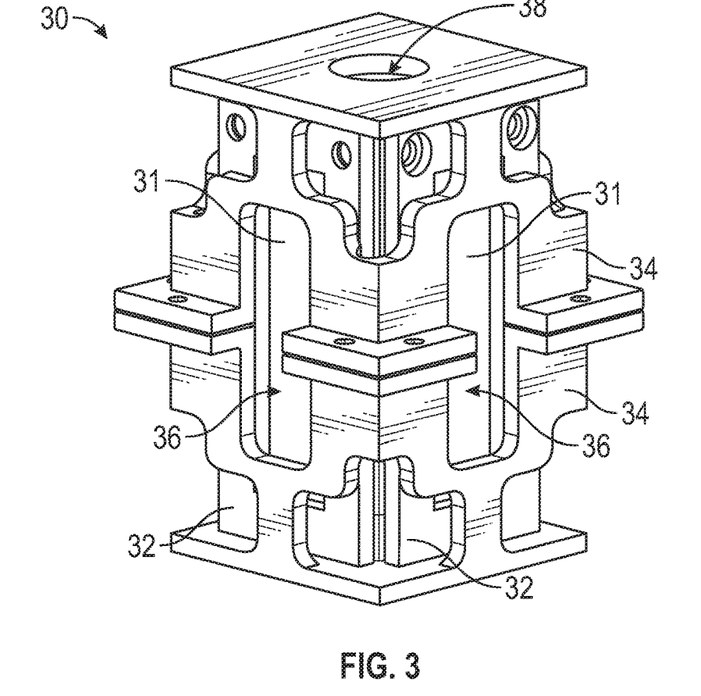
FIG. 3 is a perspective view illustrating a vapor cell assembly including a heating assembly with structural support.
Figure 4:
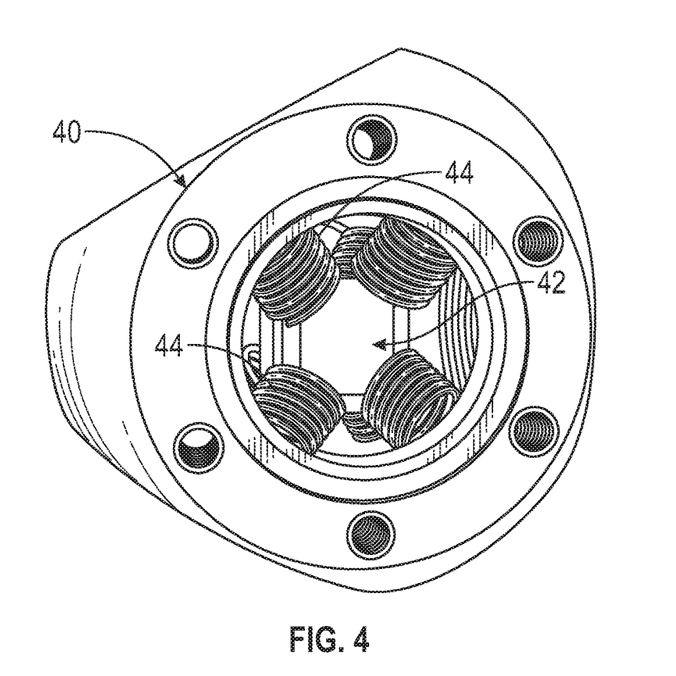
FIG. 4 is a perspective view illustrating an example of the vapor cell assembly of FIG. 3 suspended in a vacuum chamber, such as with thermal isolation springs, and used in a method of an embodiment of the present invention.

Referring now to FIGS. 3 and 4, and continuing to refer to FIGS. 1A, 1B, and 5, another embodiment of the present invention may be directed to an atomic vapor source or vapor cell assembly 42. For example, and without limitation, the vapor cell assembly 42 may preferably be a pure atomic vapor source, and may include an alkali-resistant glass base 13 defining an interior space S, an alkali-resistant glass lid 17 in contact with the alkali-resistant glass base 13 and having an optical contact bond therebetween. An evacuated environment can be formed in the interior space S, as described above with reference to FIGS. 1A, 1B, and 2, when glass base 13 is sealed via glass lid 17. An alkaline-earth metal, such as calcium and/or strontium, may be provided in the evacuated environment. A pure form of the alkaline-earth metal may be defined as at least 99.99% pure.

To provide further heating capabilities, a multi-layer heating assembly 30 may include a heat spreading layer 31 in contact with at least the alkali-resistant glass base (obscured in FIG. 3), a heating element layer 32 surrounding at least the alkali-resistant glass base, and a structural support layer 34 holding the heat spreading layer 31 and the heating element layer 32 around the alkali-resistant glass base. The multi-layer heating assembly 30 may be configured to provide optical access to the evacuated environment and alkali-earth metal therein from multiple different directions, (e.g., six different directions: three cardinal directions and their inverses) via windows 36 and 38. Optical access can be useful for providing access to a clock laser, for observing performance attributes, and for certain applications which require optical access from six sides of the cell.

As described above, the evacuated environment may be evacuated to a pressure of $\leq 10^{-6}$ Torr, or even $\leq 10^{-8}$ Torr. In one embodiment, the alkali-resistant glass base 13 may be a rectangular alkali-resistant glass base, and the heat spreading layer 31 may include sapphire slides on six sides of the rectangular alkali-resistant glass base. As such, heating element layer 32 may include picture frame-shaped aluminum nitride encased tungsten heating elements which can provide a clean and efficient method of heating in an evacuated environment. In the exemplary embodiment, the heating elements may be positioned on at least four sides of the rectangular alkali-resistant glass base to facilitate the removal of impurities as part of a bake-out process. Also, the structural support layer 34 may be a copper shell, wherein the multi-layer heating assembly may be configured to provide optical access to the evacuated environment and alkali-earth metal therein from six different directions.

As illustrated in FIG. 4, the vapor cell assembly 30 may be suspended in a vacuum chamber 40 by thermal isolation springs 44, which in some embodiments may be cut from alumina ceramic. The alumina springs 44 may provide a long thermal path to the vacuum chamber 40 (e.g., stainless steel vacuum chamber), thus reducing the conductive load of the vacuum chamber. This vapor cell assembly 30 (i.e., vapor cell and heating package) may be designed to allow increased optical access than previous attempts in vapor cells. For example, and without limitation, in some embodiments, optical access may enable laser beams from six directions (three cardinal directions and their inverses) to overlap within the vapor cell, thereby facilitating laser cooling and trapping. In other embodiments, optical access may offer other features, such as those mentioned previously. In still other embodiments, optical access may enable access from three directions, one for a laser to enter, the other to exit, and the third to provide access to a photodetector for purposes of monitoring performance.

Commercial applications of the present invention may also exploit the method described herein to enhance and enable atomic clock technology. The clocks that may be realized using the inventive method can be simple in nature and may produce units with 100X stability over current commercial atomic clocks at the same price point. Commercial applications for such clocks exist in the fields of finance, communications, power grid stabilization and synchronization, network synchronization, cyber security, encryption, signal multiplexing, and others, to name a few.

For such commercial applications, the vapor cell manufactured according to the features of the present embodiments may overcome known challenges. Such challenges in hot alkaline-earth experiments have been associated with overcoming the combination of extremely low vapor pressures and absorption cross sections. High signal-to-noise (SNR) optically dense vapors require temperatures beyond standard vacuum component ratings (>400 C) leading to complex approaches. Additionally, chemical interaction with standard vacuum glasses and copper can occur. As discussed above, the present embodiments may use an alkali-resistant glass (e.g., a calcium fluoride) chamber that is resistant or immune to chemical reaction with the alkaline-earth materials. Also, an alumina mounting (e.g., via springs 42) gives the glass chamber a long thermal pathway over a short distance to a vacuum outer chamber 40, which maintains the vapor cell assembly 42 in a vacuum environment.

The vapor sources of the present embodiments may allow for the development of single laser high-performance clocks based on simple saturated absorption spectroscopy, modulation transfer spectroscopy (MTS), or two-photon absorption. MTS and two-photon techniques, in particular, may be free of first order Doppler effects with fractional 2nd order effects occurring at $2\times10^{-11}$. MTS may also be immune to common broadening effects with the exception of power-broadening.

The above description provides specific details, such as material types and processing conditions to provide a thorough description of example embodiments. However, a person of ordinary skill in the art would understand that the embodiments may be practiced without using these specific details.

Some of the illustrative aspects of the present invention may be advantageous in solving the problems herein described and other problems not discussed which are discoverable by a skilled artisan. While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item. Thus, the scope of the invention should be determined by the appended claims and their legal equivalents, and not by the examples given.

That which is claimed is:

1. A method of making an atomic vapor source, the method comprising:
   positioning a glass base of a vapor cell in a vacuum chamber;
   providing an alkaline-earth metal in the glass base;
   positioning a linear motion feedthrough mechanism adjacent the vacuum chamber in line with the glass base in a horizontal arrangement;
   sealing and evacuating the vacuum chamber; and
   positioning, using a linear motion actuator of the linear motion feedthrough mechanism, a glass lid to contact the glass base of the vapor cell to form an optical contact bond therebetween.

2. The method according to claim 1, wherein sealing and evacuating further comprises evacuating the vacuum chamber to a pressure of $\leq 10^{-6}$ Torr.

3. The method according to claim 1, further comprising, prior to positioning the glass base:
   pre-sealing and pre-evacuating the vacuum chamber; and
   unsealing and venting the vacuum chamber to an inert gas environment.

4. The method according to claim 3, wherein pre-sealing and pre-evacuating further comprises evacuating the vacuum chamber to a pressure of $\leq 10^{-6}$ Torr.

5. The method according to claim 1 wherein positioning the glass base further comprises positioning the glass base on a platform within the vacuum chamber.

6. The method according to claim 1, further comprising:
   positioning the glass lid within the vacuum chamber adjacent the glass base of the vapor cell prior to positioning the linear motion feedthrough mechanism adjacent the vacuum chamber;
   positioning the linear motion actuator of the linear motion feedthrough mechanism proximate the glass lid positioned adjacent the glass base; and
   moving the glass lid relative to the glass base, using the linear motion actuator.

7. The method according to claim 6, further comprising providing a heating assembly within the vacuum chamber proximate the glass base; and performing a vacuum bake-out of the glass base, using the heating assembly, prior to bonding the glass lid to the glass base; and wherein the glass lid is slid into contact with the glass base via the linear motion actuator of the linear motion feedthrough mechanism.

8. The method according to claim 1, wherein the alkaline-earth metal comprises at least one of calcium and strontium, and wherein the glass base and the glass lid comprise an alkali-resistant glass.

9. A method of making an atomic vapor source, the method comprising:
   decontaminating a vacuum chamber by initially sealing and evacuating the vacuum chamber, and then unsealing and venting the vacuum chamber to an inert gas environment;
   positioning a glass base of a vapor cell in the vacuum chamber;
   providing an alkaline-earth metal in the glass base;
   positioning a glass lid adjacent to the glass base of the vapor cell;
   positioning a linear motion actuator proximate to the glass lid in a horizontal arrangement;
   moving the glass lid relative to the glass base using the linear motion actuator to apply a horizontal force;
   secondarily sealing and evacuating the vacuum chamber; and positioning, using the linear motion actuator, the glass lid to contact the glass base of the vapor cell to form an optical contact bond therebetween.

10. The method according to claim 9, wherein initially sealing and evacuating further comprises evacuating the vacuum chamber to a pressure of $\leq 10^{-6}$ Torr.

11. The method according to claim 9, wherein secondarily sealing and evacuating further comprises evacuating the vacuum chamber to a pressure of $\leq 10^{-6}$ Torr.

12. The method according to claim 9 wherein positioning the glass base further comprises positioning the glass base on a bench within the vacuum chamber.

13. The method according to claim 9, wherein the glass lid further comprises an adhesive layer on a surface thereof to aid in moving of the glass lid using the linear motion actuator.

14. The method according to claim 9, wherein the alkaline-earth metal further comprises at least one of calcium and strontium.

15. The method according to claim 9, wherein positioning the linear motion actuator further comprises positioning a linear motion feedthrough mechanism adjacent the vacuum chamber in line with the glass lid and the glass base in a horizontal arrangement.

16. An atomic vapor source prepared by a process comprising:
    initially sealing and evacuating an ultrahigh vacuum chamber;
    unsealing and venting the vacuum chamber to an over-pressurized inert gas environment;
    positioning a glass base of the vapor cell in the ultrahigh vacuum chamber;
    providing an alkaline-earth metal in the glass base;
    positioning a glass lid adjacent the glass base of the vapor cell in the ultrahigh vacuum chamber;
    positioning a linear motion feedthrough mechanism adjacent the ultrahigh vacuum chamber in line with the glass lid and the glass base in a horizontal arrangement;
    positioning a linear motion actuator of the linear motion feedthrough mechanism to contact the glass lid;
    moving the glass lid relative to the glass base using the linear motion actuator to apply a horizontal force;
    secondarily sealing and evacuating the ultrahigh vacuum chamber; and
    positioning, using the linear motion actuator to apply a horizontal force, the glass lid into contact with the glass base of the vapor cell to form an optical contact bond therebetween.

17. The atomic vapor source according to claim 16, wherein initially sealing and evacuating further comprises evacuating the ultrahigh vacuum chamber to a pressure of $\leq 10^{-6}$ Torr.

18. The atomic vapor source according to claim 16, wherein secondarily sealing and evacuating further comprises evacuating the ultrahigh vacuum chamber to a pressure of $\leq 10^{-6}$ Torr.

19. The atomic vapor source according to claim 16, wherein the alkaline-earth metal comprises at least one of calcium and strontium.

20. An atomic vapor source comprising:
    a rectangular alkali-resistant glass base defining an interior space;
    an alkali-resistant glass lid in contact with the alkali-resistant glass base and having an optical contact bond therebetween to define an evacuated environment in the interior space;
    an alkaline-earth metal in the evacuated environment; and
    a multi-layer heating assembly including a heat spreading layer in contact with at least the alkali-resistant glass base, a heating element layer surrounding at least the alkali-resistant glass base, and a structural support layer holding the heat spreading layer and the heating element layer around the alkali-resistant glass base;
    the multi-layer heating assembly configured to provide optical access to the evacuated environment and alkali-earth metal therein from multiple different directions.

21. The atomic vapor source according to claim 20, wherein the evacuated environment is evacuated to a pressure of $\leq 10^{-6}$ Torr.

22. The atomic vapor source according to claim 20, wherein the heat spreading layer comprises sapphire slides on six sides of the rectangular alkali-resistant glass base; wherein heating element layer comprises picture frame shaped aluminum nitride encased tungsten heating elements on at least four sides of the rectangular alkali-resistant glass base; wherein the structural support layer comprises a copper shell; and wherein the multi-layer heating assembly is configured to provide optical access to the evacuated environment and alkali-earth metal therein from six different directions.

23. The atomic vapor source according to claim 20, wherein the alkaline-earth metal comprises at least one of calcium and strontium.

* * * * *